(12) United States Patent
Kamiya

(10) Patent No.: US 6,426,174 B1
(45) Date of Patent: Jul. 30, 2002

(54) METHOD FOR MANUFACTURE SEMICONDUCTOR DEVICES

(75) Inventor: Masayuki Kamiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/291,014

(22) Filed: Apr. 14, 1999

(30) Foreign Application Priority Data

Apr. 23, 1998 (JP) .......................................... 10-113597

(51) Int. Cl.$^7$ ................................................. G03F 9/00
(52) U.S. Cl. ..................................... 430/311; 314/313
(58) Field of Search .............................. 430/311, 313, 430/314, 323, 324, 325, 316, 5, 326; 395/500; 364/578, 468

(56) References Cited

U.S. PATENT DOCUMENTS

| | | | |
|---|---|---|---|
| 5,635,338 A | * 6/1997 | Joshi et al. ................... | 430/325 |
| 5,646,870 A | * 7/1997 | Krivokapic et al. ......... | 364/578 |
| 5,655,110 A | * 8/1997 | Krivokapic ................... | 395/500 |
| 5,691,115 A | * 11/1997 | Okamoto et al. ............. | 430/311 |
| 5,863,709 A | * 1/1999 | Nakagawa et al. .......... | 430/326 |
| 5,902,705 A | * 5/1999 | Okamoto et al. ............... | 430/5 |
| 5,969,972 A | * 10/1999 | Kerszykowski et al. ...................... | 364/468.28 |
| 6,007,968 A | * 12/1999 | Furukawa et al. ........... | 430/314 |
| 6,020,109 A | * 2/2000 | Okamoto et al. ............ | 430/311 |

\* cited by examiner

Primary Examiner—Olik Chaudhuri
Assistant Examiner—Laura Schillinger
(74) Attorney, Agent, or Firm—Sonnenschein, Nath & Rosenthal

(57) ABSTRACT

To expose interconnection patterns of a target wring width by detecting the focus position variation and the sensitivity variation separately to correct the exposure condition without previous calculation of the correction magnitude which is optimal for exposure of the wring width of interconnection patterns of the target size of a semiconductor device, the first exposure management pattern 18 having interconnection patterns which are disposed with a certain interval and disposed so that the variation in the exposure quantity on the semiconductor substrate affects the interconnection width but the variation in focus position which occurs when the semiconductor substrate is exposed does not affect the interconnection width and the second exposure management pattern 16 having interconnection patterns which are disposed with a certain interval different from that of the first exposure management pattern and disposed so that both focus variation and exposure quantity variation affect the interconnection width are exposed on a semiconductor substrate WH, and the interconnection width of the interconnection patterns are measured to detect the variation magnitude of the focus position and the exposure quantity.

19 Claims, 13 Drawing Sheets

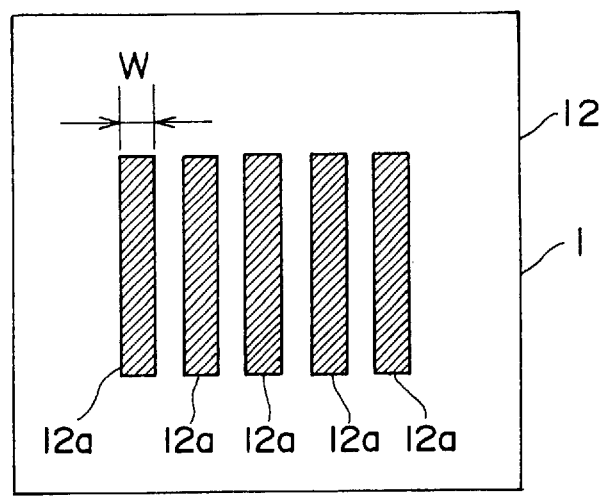
F I G. 3A
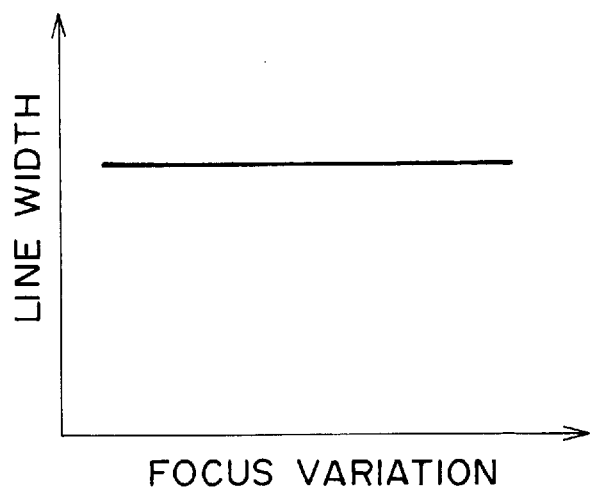
F I G. 3B
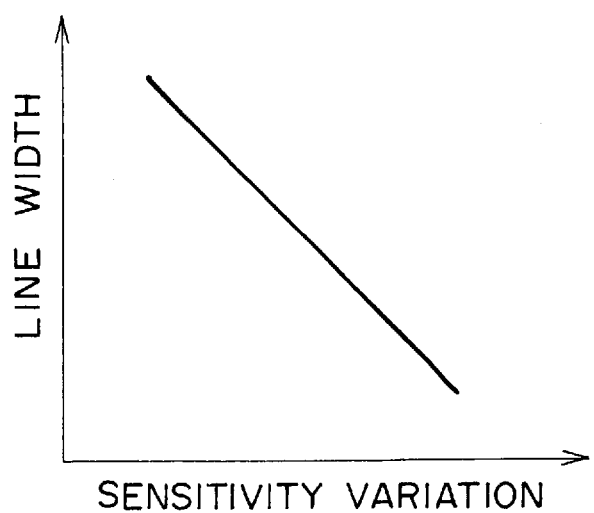
F I G. 3C

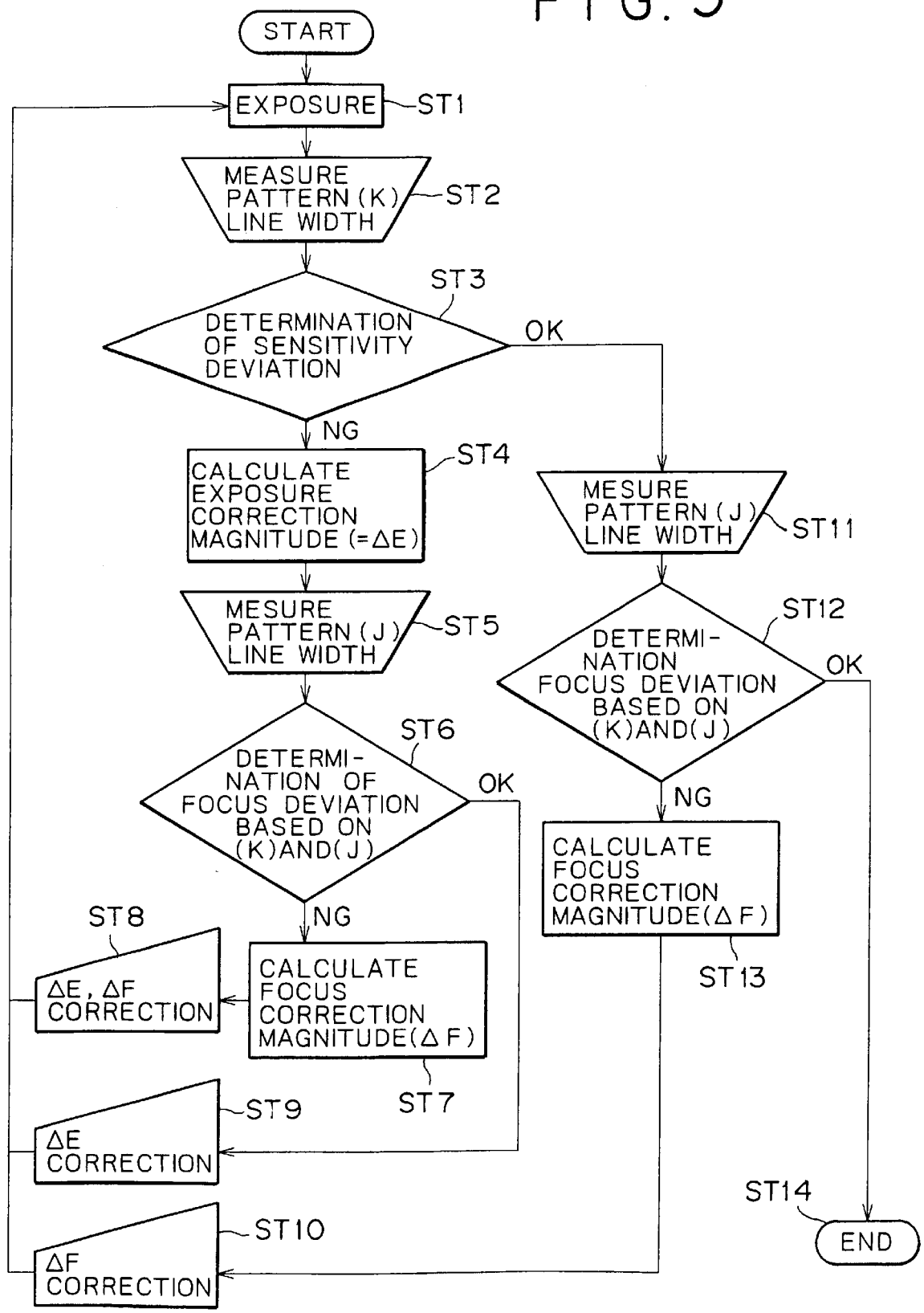

METHOD FOR MANUFACTURE SEMICONDUCTOR DEVICES

BACKGROUND OF THE INVENTION

1. Field of the Invention

This invention relates to a method for manufacturing semiconductor devices in which a semiconductor substrate is exposed so as to form an interconnection pattern for forming a desired circuit.

2. Description of Related Art

Nowadays, IC's (Integrated Circuit) having electronic circuits, which are incorporated in every electronic apparatus, are essential for minimization and upgrading of electronic apparatus. A semiconductor substrate consisting of a material such as silicon is exposed to a light with interposition of an exposure pattern for forming a predetermined circuit to form interconnection patterns, and is processed through development and other prescribed processes to manufacture an IC. In manufacturing an interconnection pattern, it is required that the correction magnitude of the variation of the focus position (referred to as focus hereinafter) that is the distance to a semiconductor substrate and the sensitivity variation (the sensitivity is corrected by correcting, for example, exposure), which vary during manufacturing, are fed back to an exposure apparatus in order to adjust the interconnection width of interconnection patterns to the target interconnection width, and thus the exposure condition is optimized.

A conventional method in which test samples are subjected to exposure before manufacturing of the IC as the product to determine the exposure condition for exposure of the interconnection pattern for forming a circuit has been used. In this method, it is needed that the focus and sensitivity variation with step-wise variation of the focus and exposure energy (referred to as exposure quantity) of an exposure apparatus is calculated previously to calculate the optimal correction magnitude as the preparative work (referred to as condition prediction). The condition prediction leads to increased work and causes poor TAT (Turn Around Time).

Another exposure method in which the above-mentioned condition prediction is not required to avoid poor TAT has been known. In this method, the exposure quantity and the interconnection width after exposure of the interconnection pattern (finished) are monitored on every lot manufactured in the past in order to predict the exposure condition of semiconductor devices manufactured under control of sensitivity variation trend, and the exposure condition is thereby determined.

FIG. 12 is a flow chart for describing yet another conventional exposure method.

In the conventional exposure method, first a predetermined exposure pattern having a prescribed interconnection pattern is exposed on a semiconductor substrate (step ST21). The interconnection width of the exposed interconnection pattern is measured (step ST22). The difference between the target interconnection width and the actual resultant interconnection width is detected to determine the sensitivity deviation (step ST23). If no sensitivity deviation is detected (OK), then the execution is brought to an end (step ST26), and otherwise if sensitivity deviation is detected, then the exposure correction magnitude ΔE is calculated from the difference detected (step ST24). The exposure quantity is corrected based on the exposure correction magnitude ΔE (step ST25).

In the trend control according to the above-mentioned exposure method, when a variation of the interconnection width off the specification is detected in the trend control of the sensitivity variation (for example, lots 6 and 10 in FIGS. 11A and 11B), to fit it to the target interconnection width (target interconnection width shown in FIG. 14) that is the target of the interconnection pattern after exposure, the exposure quantity is calculated from the exposure quantity versus interconnection width characteristic curve which has been obtained previously. This correction value is fed back to the exposure apparatus to vary the exposure condition. Also in the case in which the wring width of manufactured semiconductor devices is measured to perform trend control for fine correction even if variation of the interconnection width of interconnection pattern after exposure off the specification is detected, correction is performed based on the exposure quantity.

However, because the deviation in interconnection width is corrected only by varying the exposure quantity in this exposure method, the deviation in focus is not corrected, and it causes the following problem.

FIG. 13A is a finished interconnection width characteristics of an interconnection pattern for simultaneous variation of the sensitivity and focus. FIG. 13B is a finished interconnection width characteristics after correction of an interconnection pattern obtained when the deviation is corrected only by varying exposure quantity for simultaneous variation of the sensitivity and focus.

In FIG. 13A and FIG. 13B, the axis of abscissa represents the focus and the axis of ordinate represents the interconnection width (line width).

Correction according to the conventional exposure method shown in FIG. 12 shows the result that the actual line width is within the allowance of the target line width for sparse pattern, but the actual line width exceeds the allowable upper limit of the line width specification for uncontrolled dense pattern because the correction depends on only exposure quantity ΔE. Though the actual line width is within the allowance for the sparse pattern, the focus versus interconnection width characteristics fluctuates and the variation of focus affects the stability of the exposed interconnection width significantly because the focus deviation remains as it was.

The interconnection width characteristics j and k represents the interconnection width characteristics of two interconnection patterns which are different in the density of finished interconnection width. The interconnection width characteristics j represents the interconnection width characteristics of the sparse interconnection pattern, on the other hand, the interconnection width characteristics k represents the interconnection width characteristics of the dense interconnection pattern.

On a semiconductor substrate which is a component of a semiconductor device, various interconnection patterns different in the line density are formed actually. Therefore, the interconnection width characteristics versus focus depends on the line density of the interconnection pattern.

When a exposure pattern served as a transfer pattern for forming a circuit on a semiconductor substrate by exposure is copied on a semiconductor substrate by exposure, the focus versus interconnection width characteristics changes gradually from the mountain-shape to the valley-shape as shown in the order from FIG. 5B, to FIG. 6B, and FIG. 7B as the interconnection pattern becomes denser as shown in the order from FIG. 5A, to FIG. 6A, and FIG. 7A.

In the case that the focus F deviates from the ideal focus F1 as shown in FIG. 13A, though the position on X-axis at the inflection point of the interconnection width characteristics corresponds to the ideal focus F1, the focus which is actually exposed to a light in manufacturing process corresponds to the vertical dotted line F (the difference ΔF between the focus F shown with the dotted line and the above-mentioned ideal focus F1 is referred to as focus deviation hereinafter).

The above-mentioned situation causes the difference in finished interconnection width after exposure between the sparse interconnection width characteristics and the dense interconnection width characteristics. Correction of the exposure quantity by exposure correction magnitude ΔE only moves the interconnection width characteristics k and the interconnection width characteristics j vertically (in the direction of interconnection width) along the axis of ordinate in the graph shown in FIG. 13A, and it is impossible to solve the finished interconnection width difference due to the above-mentioned focus deviation ΔF.

In this exposure method, only the interconnection width characteristics j is controlled as shown in FIG. 13B. Therefore in some cases, the pattern of interconnection width characteristics k exceeds the USL (USL is used as an abbreviation of upper specification limit of the interconnection width. LSL is used as an abbreviation of lower specification limit of the interconnection width.) Outside the specification after correction, and defective products are manufactured.

Another problem of focus deviation ΔF is the area W1 (the interconnection pattern characteristics j is inclined steeply) where the variation in the interconnection width to the variation in the focus is larger than that at the above-mentioned inflection point for the ideal focus F1 though the interconnection width characteristics j is within the target line width as shown in FIG. 13B, and the stability of the interconnection width of the exposed interconnection pattern to the variation in focus is poor. Problems described herein above arise from the difficulty in separate correction of the variation in focus F and the variation in sensitivity.

It is the object of the present invention to solve the above-mentioned problems by providing a method for manufacturing semiconductor devices in which the focus position variation and the sensitivity variation are separated and detected respectively without previous calculation of the optimal correction magnitude for obtaining the target-sized interconnection width of interconnection pattern of semiconductor devices to correct the exposure condition and to secure the exposure of the interconnection pattern of the target interconnection width, and further the trend of the focus position and the sensitivity is controlled accurately to secure the accurate exposure of the interconnection patterns which are different in the line density of the interconnection pattern and to improve the production efficiency of the semiconductor device.

SUMMARY OF THE INVENTION

The above-mentioned object of the present invention is achieved by applying a method for manufacturing semiconductor devices in which exposure is performed to form an interconnection pattern of the predetermined circuit on a semiconductor substrate with correction of the exposure condition comprising the first step for exposing on the semiconductor substrate the first exposure management pattern having interconnection patterns which are disposed with a certain interval and disposed so that the variation in the exposure quantity on the semiconductor substrate affects the interconnection width but the variation in focus position which occurs when the semiconductor substrate is exposed does not affect the interconnection width, and the second exposure management pattern having interconnection patterns which are disposed with a certain interval different from that of the first exposure management pattern and disposed so that both focus variation and exposure quantity variation affect the interconnection width, the second step for measuring the interconnection width of the interconnection patterns of the respective first interconnection pattern and the second interconnection pattern exposed on the substrate by use of the respective first exposure management pattern and the second exposure management pattern, the third step for detecting the variation magnitude of the focus position based on the difference in interconnection width of the interconnection pattern between the first interconnection pattern and the second interconnection pattern, and the fourth step for detecting the variation magnitude of the exposure quantity based on the difference between the interconnection width of at least one interconnection pattern of the first interconnection pattern and the second interconnection pattern and the predetermined target interconnection width.

In the method for manufacturing semiconductor devices of the present invention in which exposure is performed to form an interconnection pattern of the predetermined circuit on a semiconductor substrate with correction of the exposure condition, the first exposure management pattern having interconnection patterns for exposure which are disposed with a certain interval and disposed so that the variation in the exposure quantity on the semiconductor substrate affects the interconnection width but the variation in focus position formed when the semiconductor substrate is exposed does not affect the interconnection width, and the second exposure management pattern having interconnection patterns which are disposed with a certain interval different from that of the first exposure management pattern and disposed so that both focus variation and exposure quantity variation affect the interconnection width are exposed on the semiconductor substrate. Next, the interconnection width of respective interconnection patterns of the respective first interconnection pattern and the second interconnection pattern exposed by use of the respective first exposure management pattern and the second exposure management pattern is measured. The error of the focus position is detected based on the difference in the interconnection width of respective interconnection patterns between the first interconnection pattern and the second interconnection pattern. Further, the error of the exposure quantity is detected based on the difference between the interconnection width of at least one interconnection pattern of the first interconnection pattern and the second interconnection pattern and the previously set target interconnection width. Thus, the focus position variation and sensitivity variation are detected separately without previous calculation of the correction magnitude which is optimal for exposure of an interconnection pattern with a target-sized wring width of a semiconductor device.

BRIEF DESCRIPTION OF THE DRAWINGS

FIG. 3A to FIG. 3C are an enlarged plan view and characteristic graphs of the first exposure pattern which are shown as an example of control pattern of FIG. 1.

FIG. 9 is a flow chart for describing an exemplary method for manufacturing semiconductor devices as a preferred embodiment of the present invention.

DETAILED DESCRIPTION OF THE PREFERRED EMBODIMENTS

Embodiments of the present invention will be described in detail hereinafter with reference to the drawings.

Embodiments which will be described hereinafter are preferred embodiments of the present invention and include various preferable technical limitations, however, the scope of the present invention is by no means limited to these embodiments unless otherwise specified.

The outline of a method for manufacturing semiconductor devices on which semiconductor integrated circuits IC (referred to as Integrated Circuit hereinafter) are mounted is described herein under. First, an exposure pattern having a layout which are designed based on a previously decided specification is prepared. The exposure pattern is transferred onto a semiconductor substrate (referred to as wafer WH hereinafter) by use of an exposure apparatus (exposure process). The interconnection pattern on the exposed substrate is subjected successively to a development and etching process, impurity diffusion process, vapor deposition process, and fabrication inspection process, and an IC is manufactured.

A manufacturing process (the exposure method in the above-mentioned exposure process) which is a preferred embodiment of the present invention will be described herein under.

Figure 1:
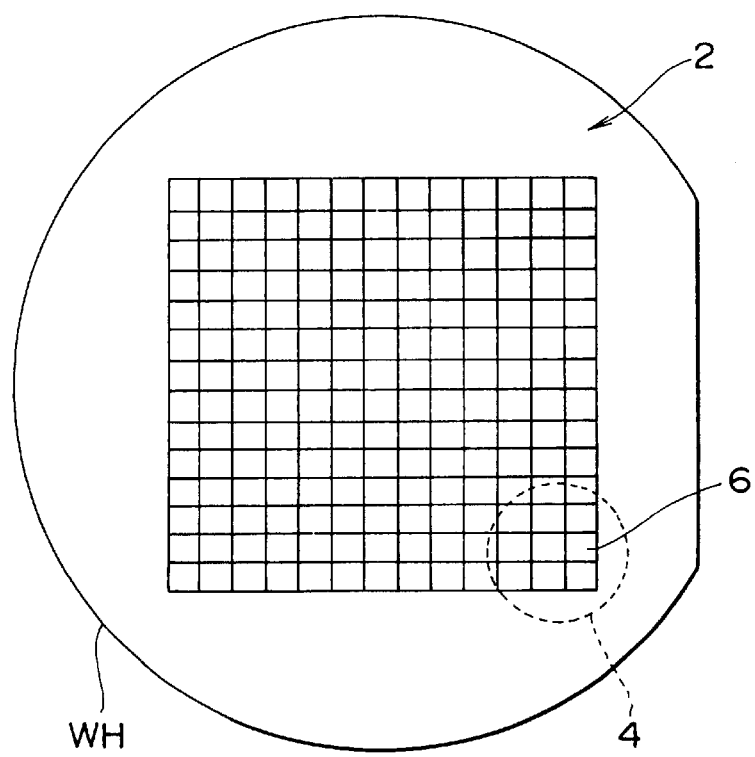
FIG. 1 is a plan view for showing the whole wafer having exposed integrated circuit.
Figure 2:
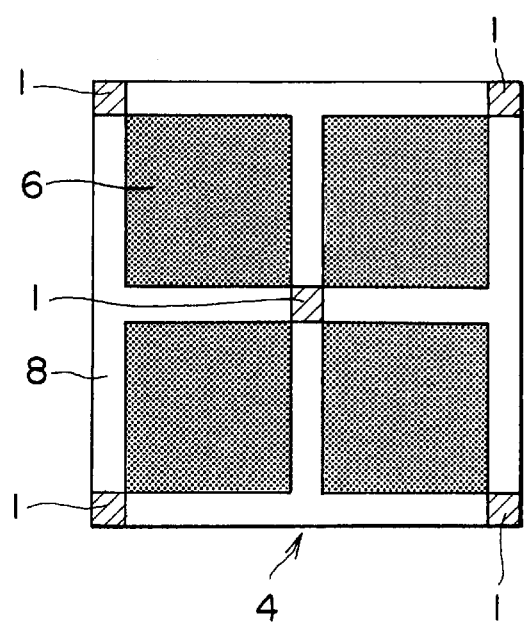
FIG. 2 is an enlarged plan view of the wafer shown in FIG. 1.

FIG. 1 is a plan view of a semiconductor substrate on which semiconductor integrated circuits are formed. FIG. 2 is an enlarged plan view for illustrating semiconductor integrated circuits formed on the semiconductor substrate.

In the explanation described hereinafter, "exposure pattern" represents a pattern of a circuit which is to be transferred onto a wafer WH by use of an exposure apparatus, and "actual circuit pattern" represents a pattern of one semiconductor integrated circuit (referred to as integrated circuit hereinafter) on a wafer WH which has been transferred by use of the exposure pattern, and "interconnection pattern" represents an individual interconnection line of a pattern of a circuit which will be transferred or has been transferred on a wafer WH.

Further, "sparse" means that adjacent interconnection patterns are apart each other or no adjacent interconnection pattern exists, and "dense" means that the distance between adjacent interconnection patterns is narrower than that of a sparse interconnection patterns.

The exposure apparatus exposes an integrated circuit 2 on the surface of a wafer WH based on the predetermined exposure condition. The exposure apparatus can not expose all the integrated circuit at a time on the wafer WH, and exposes a plurality of times dividedly. One shot pattern 4 shows an area range of actual circuit patterns 6 exposed at a time by the exposure apparatus. The exposure apparatus which is assumed to expose, for example, four actual circuit patterns at a time as shown in FIG. 2 is described.

Verification of error of interconnection width (line width) corresponding to the density of interconnection pattern One shot pattern 4 has actual circuits 6, each of which is served as one integrated circuit for constituting the integrated circuit 2 on the wafer WH as shown in FIG. 2, scribe lines 8 for defining actual circuit patterns 6 each other, and management patterns 1.

The management pattern 1 is a pattern which is exposed optionally to correct the exposure condition based on measured interconnection width of the interconnection pattern after exposure. Management patterns 1 are disposed, for example, in a manner that four manage patterns are located at the four corners of one shot pattern 4 and one management pattern is located at the center of the one shot pattern 4 so that these management patterns are not overlapped on the actual circuit patterns 6.

Figure 4A:
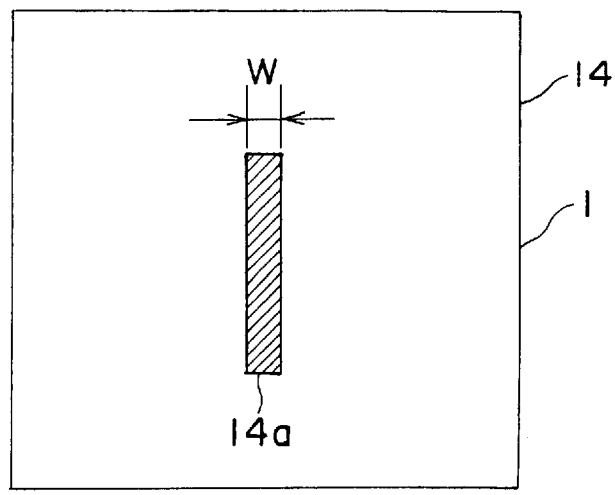
FIG. 4A to FIG. 4C are an enlarged plan view and characteristic graphs of the second exposure pattern which are shown as an example of control pattern of FIG. 1.

As the management pattern 1, at least two correction interconnection patterns are prescribed, for example, a first management pattern 12 for exposing interconnection patterns 12a densely with a certain interval as shown in FIG. 3A and a second management pattern 14 for exposing interconnection patterns 14a sparsely as shown in FIG. 4A. Herein, the first management pattern 12 and second management pattern 14 shown respectively in FIG. 3A and FIG. 4A show individual management pattern 1 which is disposed in the one shot pattern 4 shown in FIG. 2.

A first management pattern 12 comprises, for example, five interconnection patterns 12a which are exposed with a certain interval as shown in FIG. 3A. The first management pattern 12 is an exposure pattern comprising densely exposed interconnection patterns. In the first management pattern 12, the interconnection width remains consistently as shown in FIG. 3B regardless of variation in focus due to variation in exposure condition (Focus is used as a term for representing the focus position that is one of the exposure condition hereinafter). On the other hand, in the first management pattern 12, the interconnection width shows a negative gradient as shown in FIG. 3C with the sensitivity variation due to variation in exposure condition (the sensitivity is used as a term for representing the exposure condition that is sensitive to the exposure quantity, which is one of the exposure condition).

Figure 4B:
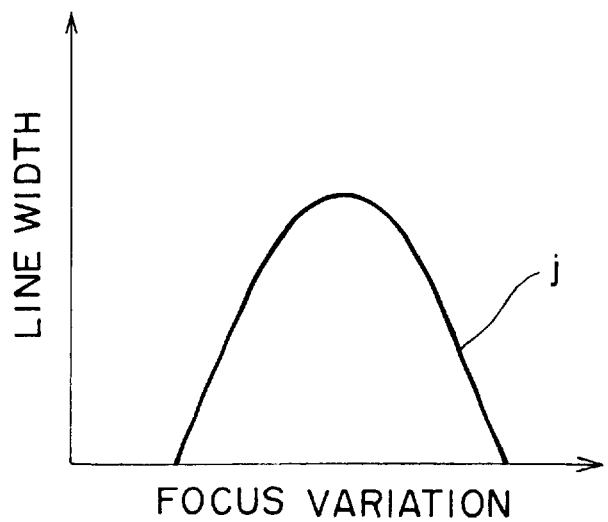
Figure 4C:
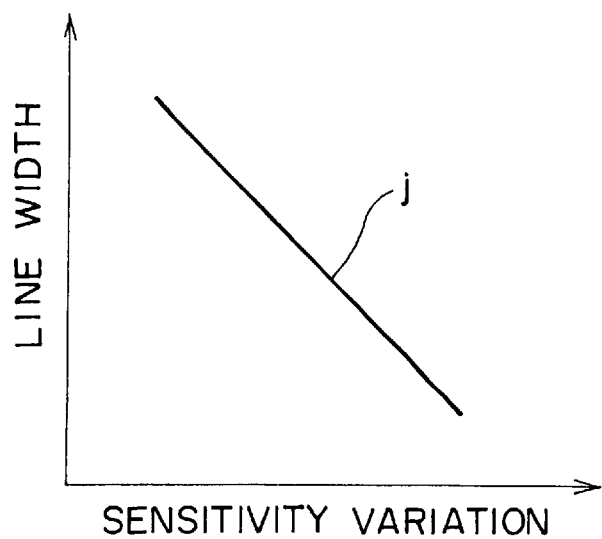

A second management pattern 12 comprises, for example, one interconnection pattern 14a, which is an example of an exposure pattern comprising sparsely exposed interconnection pattern. The first management pattern is formed so that the distance between interconnection patterns is sufficiently wide. The second management pattern 14 shows a mountain-shaped parabola as shown in FIG. 4B when the focus varies due to variation in exposure condition for exposure. On the other hand, the second management pattern 14 shows a negative gradient as shown in FIG. 4C with the sensitivity variation due to variation in exposure condition.

As described herein above, it is understandable that the sensitivity variation does not affect the interconnection width but the focus variation affects the wring width due to the difference in the density of the interconnection pattern between the first management pattern 12 and the second management pattern 14. The optimal management pattern 1 which should be used to obtain an interconnection pattern with stable interconnection width by use of the exposure apparatus by feeding back the correction magnitude, which is obtained by utilizing error of interconnection width corresponding to the density of the interconnection pattern, is examined herein under.

Verification of Preferable Management Pattern

To select a suitable management pattern for management of the interconnection width as described herein above, for example, three patterns shown in FIG. 5A, FIG. 6A, and FIG. 7A having different respective pattern density, which are candidates of the management pattern 1, are exposed to form interconnection patterns. When, the manufacturing condition described herein under is prescribed.

Exposure apparatus: KrF Eximer Stepper (NA: 0.50, σ: 0.60)

Photoresist: SEPR-3404T (film thickness: 0.25 μm)

Width of line width management pattern (management pattern) : 0.25 μm

In the exposure method for a semiconductor device as the preferred embodiment of the present invention, suitable, for example, two management patterns are selected from three interconnection patterns.

Figure 5A:
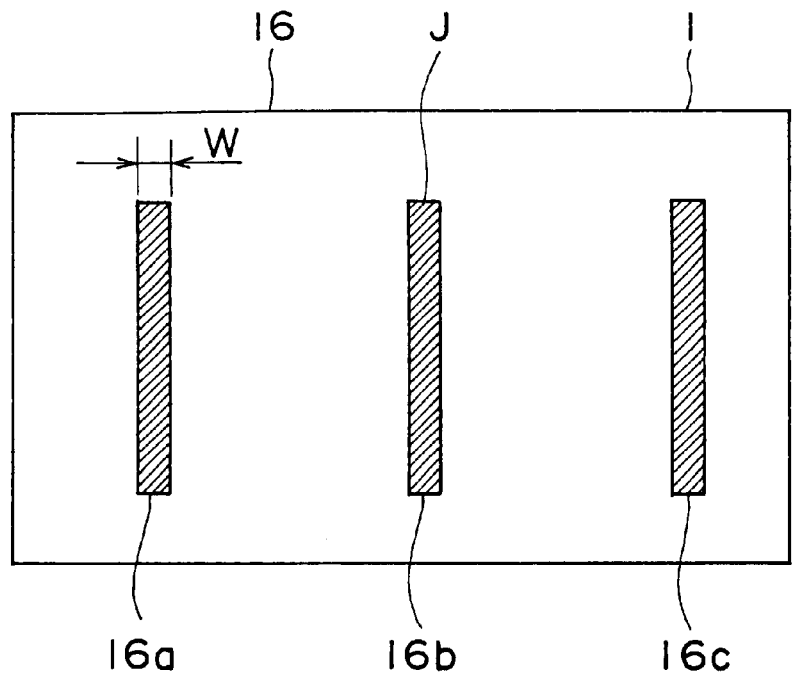
FIG. 5A and FIG. 5B are an enlarged plan view and a characteristic graph of the third exposure pattern which are shown as an example of control pattern of FIG. 1.
Figure 5B:
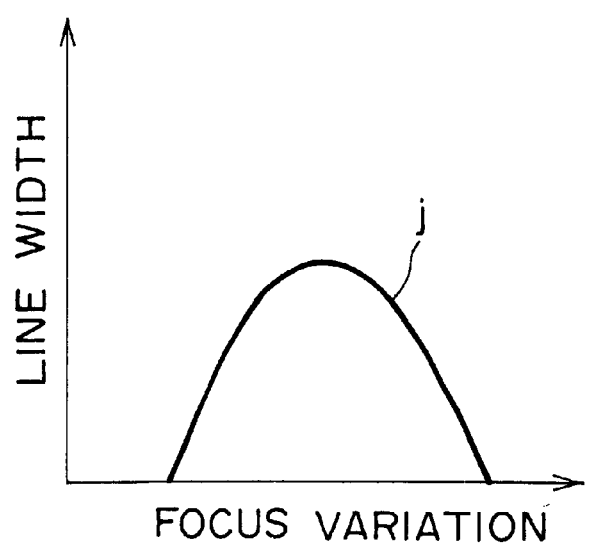

FIG. 5A shows an example of the third management pattern 16 (second exposure management pattern) comprising interconnection patterns 16a, 16b, and 16c which are disposed sparsely. FIG. 5B shows the interconnection width characteristics of the third management pattern 16 with focus variation which is one of the exposure condition. According to FIG. 5B, the interconnection width variation shows a mountain-shaped parabola correspondingly to the focus variation. The distance between interconnection patterns in the third management pattern 16 which shows characteristics as shown in FIG. 5B is, for example, 0.27 μm.

Figure 6A:
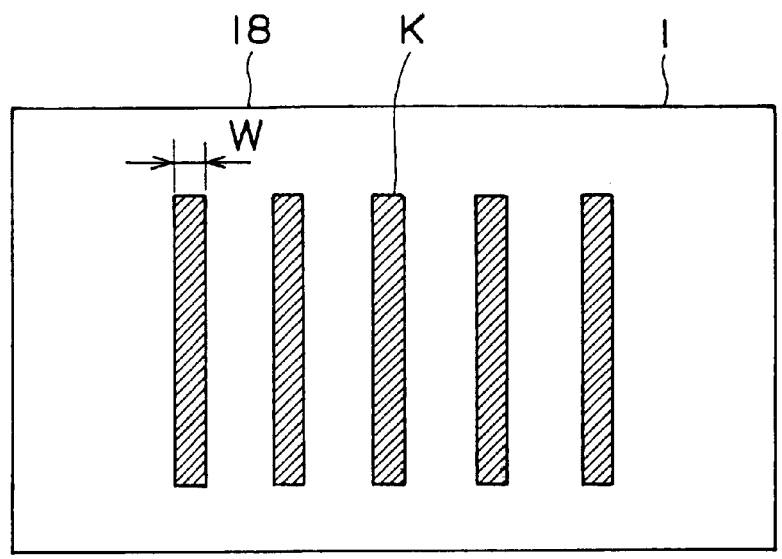
FIG. 6A and FIG. 6B are an enlarged plane view and a characteristic graph of the fourth exposure pattern which are shown as an example of control pattern of FIG. 1.
Figure 6B:
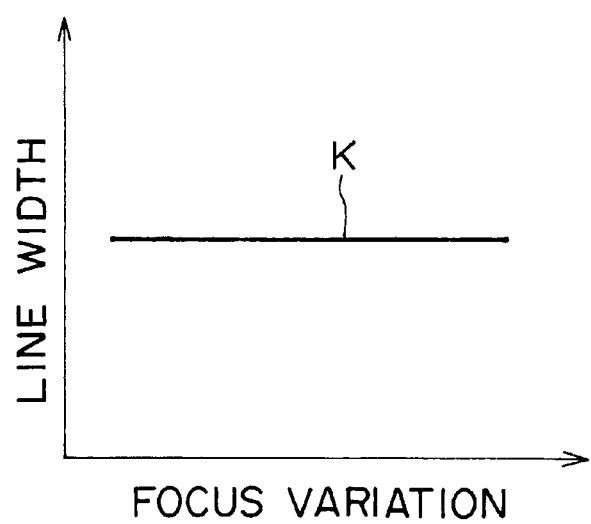

FIG. 6A shows an example of the fourth management pattern 18 (first exposure management pattern) comprising interconnection patterns which are disposed densely. FIG. 6B shows the interconnection width characteristics with focus variation which is one of the exposure condition. According to FIG. 6B, the interconnection width variation is constant with focus variation. To obtain the characteristics as shown in FIG. 6B, for example, the following manufacturing condition is preferably used.

Range of variation of exposure quantity (sensitivity): 40±4 mJ/cm$^2$

Focus variation range: Just Focus (optimal focus)±0.4 μm

Distance between interconnection patterns: 0.25±0.02 μm

The flat characteristics shown in FIG. 6B is defined so that the variation in the interconnection width is within ±5% or smaller of the interconnection management pattern size (line width). The distance between interconnection patterns in the fourth management pattern 18 is, for example, 0.25 μm.

Figure 7A:
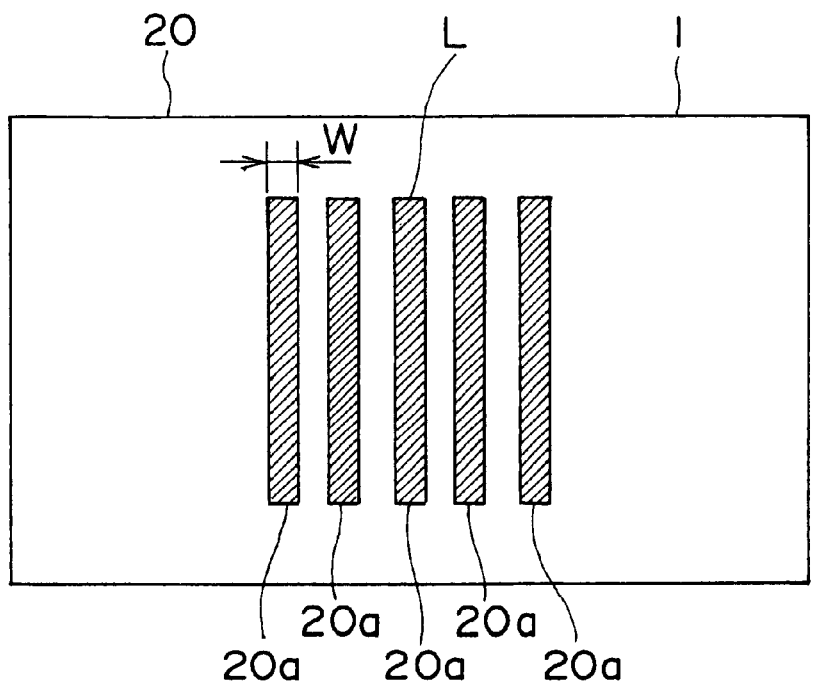
FIG. 7A and FIG. 7B are an enlarged plane view and a characteristic graph of the fifth exposure pattern which are shown as an example of control pattern of FIG. 1.
Figure 7B:
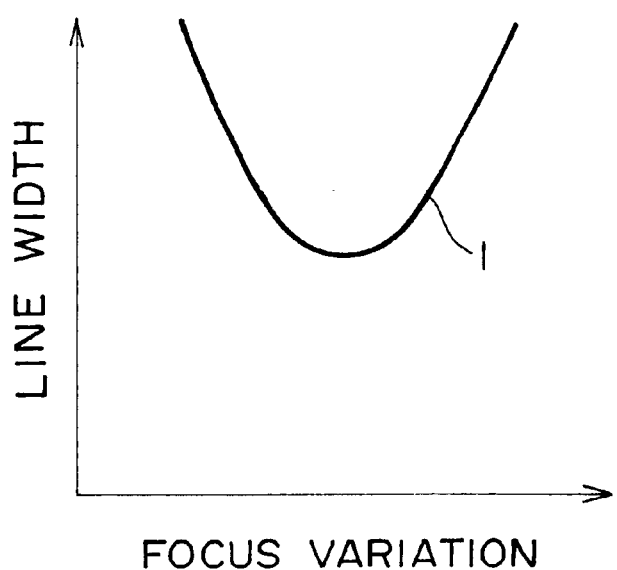

FIG. 7A shows an example of the fifth management pattern 20 comprising interconnection patterns 20a which are disposed very closely each other. FIG. 7B shows the interconnection width characteristics of the fifth management pattern 20 with focus variation of the exposure apparatus. According to FIG. 7B, the interconnection width variation shows a valley-shaped parabola with the focus variation. The distance between interconnection patterns in the fifth management pattern 20 which shows the characteristics as shown in FIG. 7B is, for example, 0.23 μm.

The exposure method which is used for correcting the exposure condition to stabilize the interconnection width based on the interconnection width characteristics of the respective third management pattern 16, fourth management pattern 18, and fifth management pattern 20 described herein above is described hereinafter. In the explanation described herein under, the exposure method is described for the case that the fourth management pattern 18, in which the interconnection width is insensitive to the focus variation, and the third management pattern 16, in which the interconnection width is sensitive to the focus variation, are employed. Though the third management pattern 16 is employed in this explanation, but the fifth management pattern may be employed instead of the third management pattern 16.

It is required to correct the error of interconnection width of an interconnection pattern by controlling the focus and/or exposure quantity in setting of the exposure condition of an exposure apparatus to correct the interconnection width variation of an exposed interconnection pattern. In the exposure method for the preferred embodiment of the present invention, whether the focus is corrected, the exposure quantity is corrected to correct the sensitivity, or both are corrected should be determined.

Figure 8:
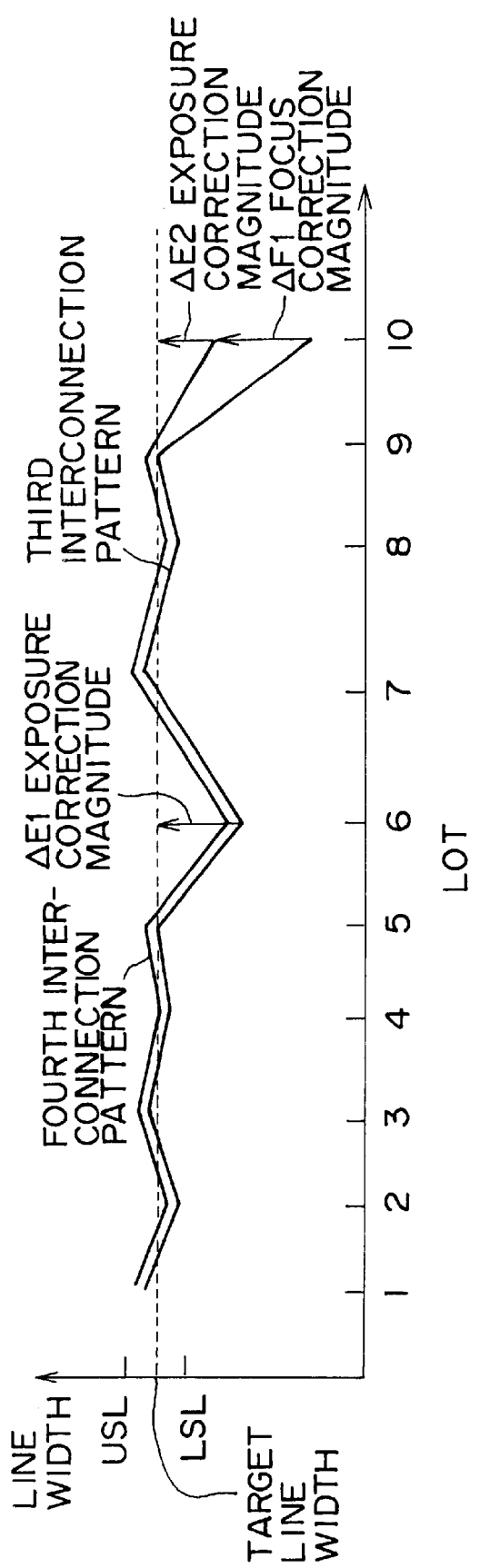
FIG. 8 is a graph for showing the interconnection width of the interconnection pattern of every lot when the third exposure pattern shown in FIG. 5 and the fourth exposure pattern shown in FIG. 6 are exposed.

FIG. 8 shows the result of average interconnection width values of an interconnection pattern for every lot when IC's are manufactured by means of an exposure apparatus. In FIG. 8, the axis of abscissa represents the lot number, and the axis of ordinate represents the interconnection width for every lot. In this explanation, the target line width of the axis of abscissa represents the target interconnection width of the exposed interconnection pattern, and USL represent the upper specification limit of interconnection width and LSL represents the lower specification limit.

In FIG. 8, it is obvious that the lot number 6 and the lot number 10 are off-specification products.

The lot number 6 shows the approximately same variation in interconnection width for the third management pattern 16 and the fourth management pattern 18. The same variation is caused from the improper sensitivity which affects the interconnection width of both third management pattern 16 and fourth management pattern 18 as described hereinbefore. In other words, in the case of the lot number 6, the line width which is nearly equal to the target line width is obtained by correcting the exposure quantity ΔE which is one of the exposure condition of the exposure apparatus.

On the other hand, in the case of the lot number 10, the difference is featured in that the interconnection width variation of the fourth management pattern 16 is larger than the interconnection width variation of the third management pattern 18. The interconnection width variation from the target line width of the fourth management pattern 18 is due to the exposure apparatus sensitivity as described in explanation of the lot number 6. However, in the case of the lot number 10, the interconnection width of the third management pattern 16 varies more seriously than the interconnection width of the fourth interconnection pattern due to focus variation. Therefore, it is required to correct the sensitivity as one of the exposure condition of the exposure apparatus and also to correct the focus.

In other words, the error of the interconnection width of the interconnection pattern caused when the exposure pattern is transferred onto a wafer WH by the exposure apparatus is due to the variation in sensitivity and/or focus. It is required to perform exposure with correction of both sensitivity and focus.

FIG. 9 is a flow chart for describing a method for manufacturing semiconductor devices as a preferred embodiment of the present invention.

As described herein above, an exposure pattern having the management pattern 1 including the third management pattern 16 and the fourth management pattern 18 is prepared through the layout design. The exposure pattern is transferred onto a wafer WH by the exposure apparatus (step ST1). The exposed interconnection width of, for example, the fourth management pattern 18 is measured (step ST2).

Whether the measured interconnection width of the fourth management pattern 18 is within a range from USL to LSL shown in FIG. 8 is determined (step ST3), and if the result is YES, then the wring width of the third management pattern 16 is measured (step ST11). The focus deviation is determined based on the interconnection width of the fourth management pattern 18 and the third management pattern 16 (step ST12). If the focus deviation is not detected, then execution proceeds to the end (step ST14), and if the focus deviation is detected, then the focus deviation ΔF is calculated (step ST13). The focus which is one of the exposure condition of the exposure apparatus is corrected based on the focus deviation ΔF with reference to the focus versus interconnection width characteristic table for storing the information of the interconnection width corresponding to the focus which has been prepared previously (step ST10).

On the other hand, if the measured interconnection width of the fourth management pattern 18 is not within a range between USL and LSL shown in FIG. 8 and the sensitivity deviation is detected (step ST3), then the exposure correction magnitude ΔE of the exposure condition of the exposure apparatus is calculated (step ST4). Next, the interconnection width of the third management pattern 16 is measured (step ST5). The focus deviation is determined based on the interconnection width of the fourth management pattern 18 and the third management pattern 16 (step ST6).

If the focus deviation is not detected, then the exposure correction magnitude ΔE is corrected with reference to the sensitivity versus interconnection width characteristic table for storing the information of the interconnection width corresponding to the sensitivity which has been prepared previously (step ST9), and if the focus deviation is detected, then the focus deviation ΔF is calculated (step ST7). The exposure quantity which is one of the exposure condition is corrected based on the exposure correction magnitude ΔE with reference to the focus versus interconnection width characteristics, and the focus which is one of the exposure condition is corrected based on the focus deviation with reference to the sensitivity versus interconnection width characteristics (step ST8).

As described hereinbefore, the exposure condition is corrected and exposure is performed in the exposure apparatus. IC's are manufactured from wafers WH through developing process, etching process, impurity diffusion process, vacuum evaporation deposition process, and fabrication and inspection process.

The interconnection pattern exposed according to the exposure method described hereinbefore exhibits the effect as described herein under. The effect of the exposure method in according with the preferred embodiment of the present invention is described with reference to FIG. 9 to FIG. 11.

The effect is described mainly with reference to the typical focus versus interconnection width characteristic graph such as FIG. 10A, FIG. 10B, FIG. 11A, and FIG. 11B.

In FIG. 10A, FIG. 10B, FIG. 11A, and FIG. 11B, the axis of abscissa represents the focus and the axis of ordinate represents the interconnection width (line width) respectively. In the exposure method, it is assumed that the focus is fixed at one point for exposure. A dotted line 22 which extends in the vertical direction represents the focus which is set previously in the exposure apparatus, and represents the actual focus condition for exposure.

Points in FIG. 11 indicated by ○ shows the actual exposure quantity and the exposure of focus which is one of the exposure condition, the value at the intercept of ○ and the dotted line 22 represents the finished interconnection width (size) and represents the same meaning as the line width result of arbitrary one lot shown in FIG. 8. Herein, when the exposure quantity of the exposure method varies, the interconnection width characteristics 24 and 26 varies according to the characteristics same as that shown in FIG. 3C and FIG. 4C.

Occurrence of Only Sensitivity Variation

Figure 10A:
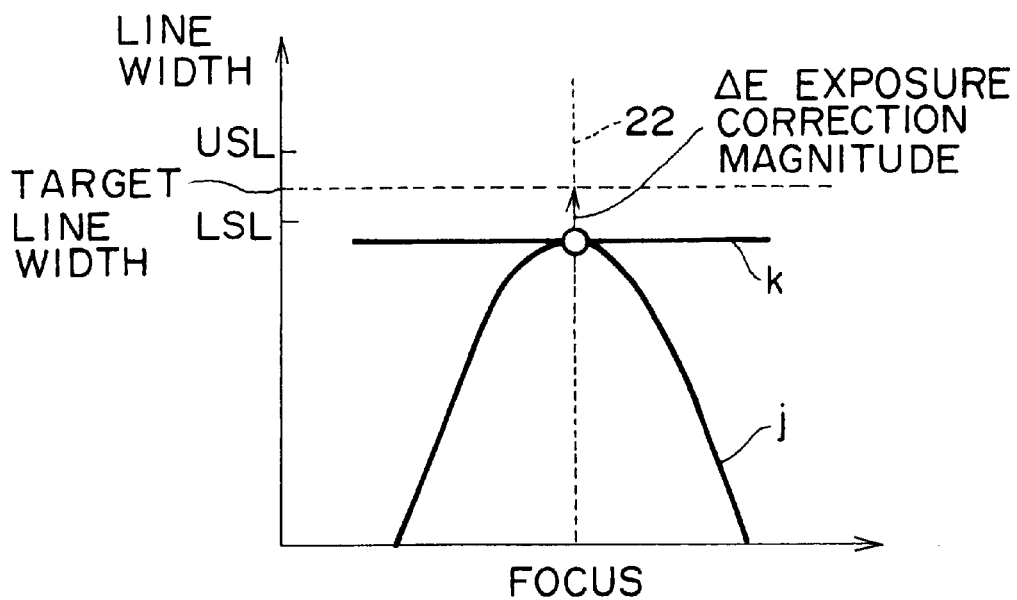
FIG. 10A and FIG. 10B are characteristic graphs for describing the relation between the focus and the interconnection width.
Figure 10B:
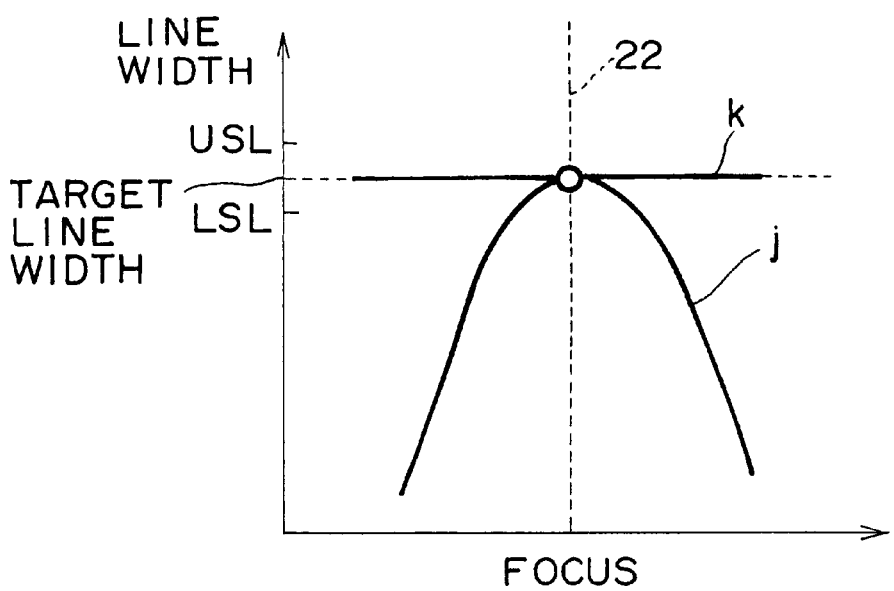

FIG. 10A shows the focus versus interconnection width characteristics for the case of occurrence of only sensitivity variation. FIG. 10B shows the resultant focus versus interconnection width characteristics after correction of the exposure condition for the case of occurrence of only sensitivity variation.

When the sensitivity varies, correction is performed by the same method as used conventionally. In FIG. 10A, the difference between the target line width and the actually exposed interconnection width result (the point shown by ○) is large, and the actual result exceeds the line width lower specification limit. When the result is corrected by the correction magnitude ΔE by means of the exposure quantity, both dense pattern characteristics k and sparse pattern characteristics j are moved upward and adjusted to the target line width.

Occurrence of Both Sensitivity Variation and Focus Variation

Figure 11A:
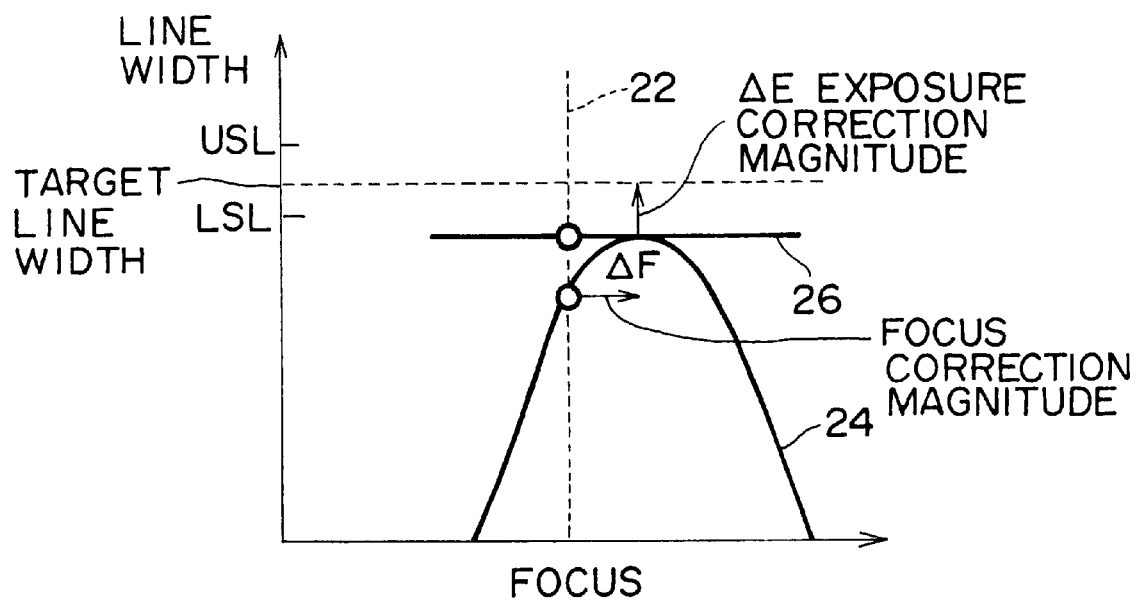
FIG. 11A and FIG. 11B are characteristic graphs for describing the relation between the focus and the interconnection width.
Figure 11B:
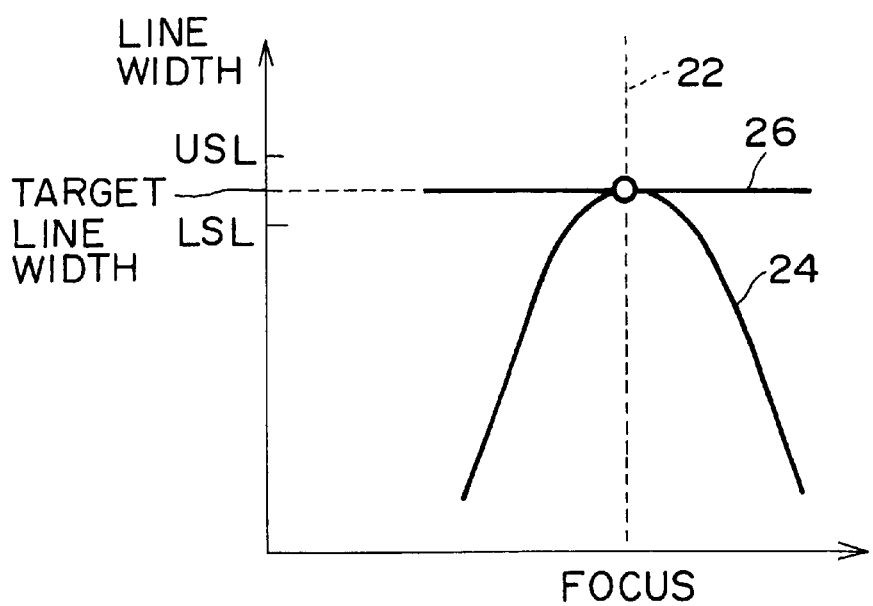
Figure 12:
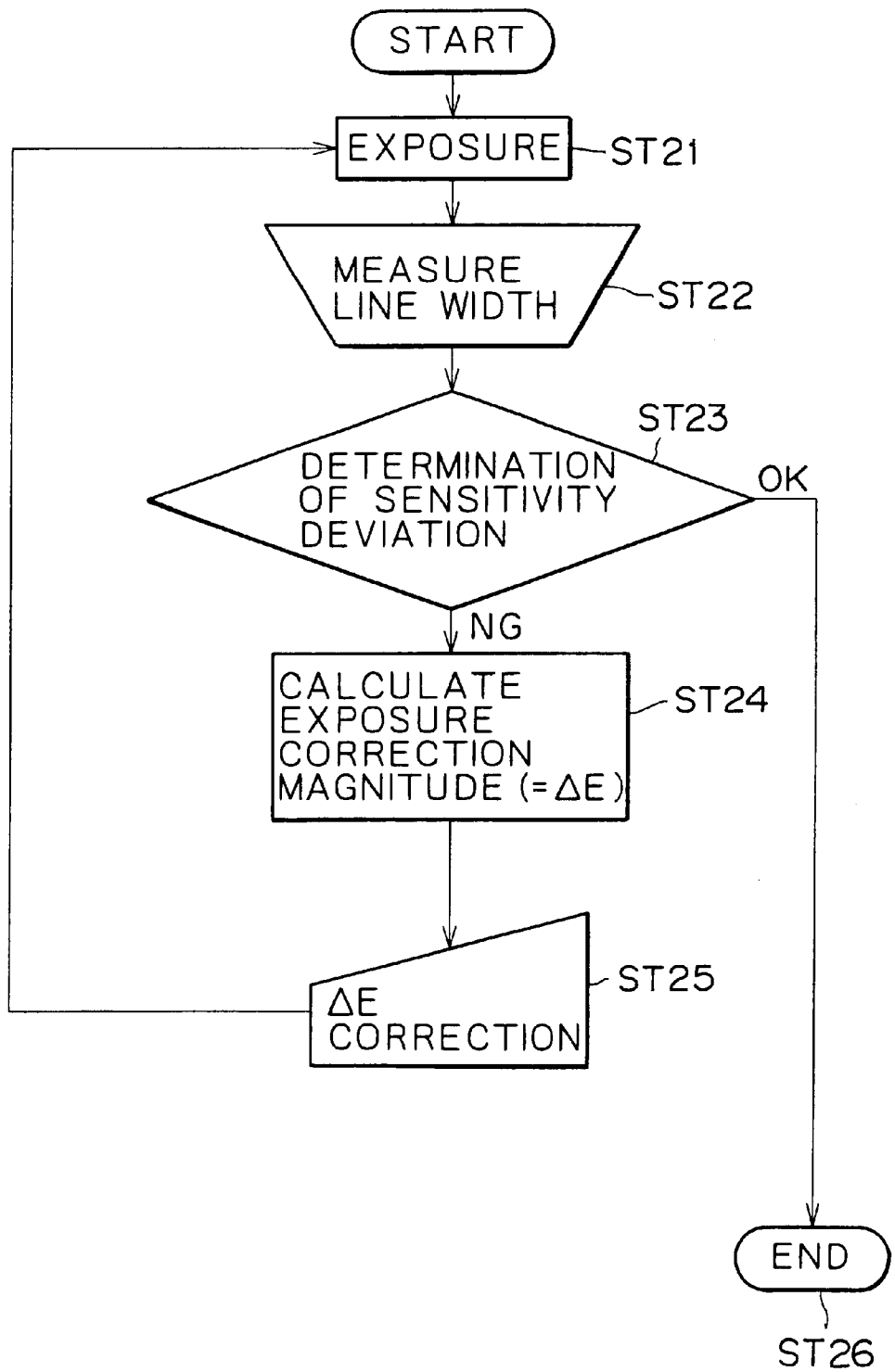
FIG. 12 is a flow chart for describing a conventional method for manufacturing semiconductor devices.
Figure 13A:
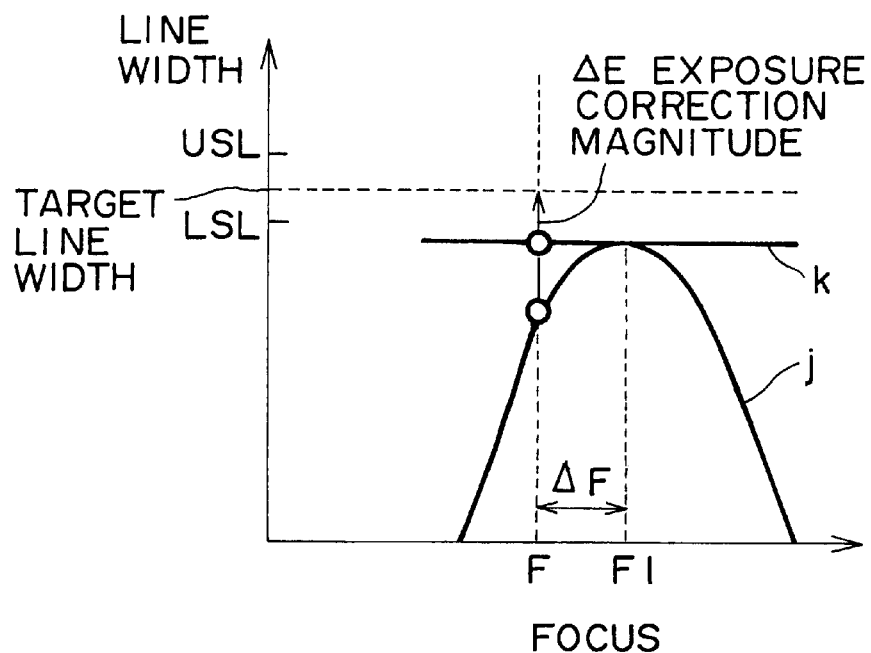
FIG. 13 are graphs for describing the interconnection width of every lot when the exposure method shown in FIG. 12 is employed.
Figure 13B:
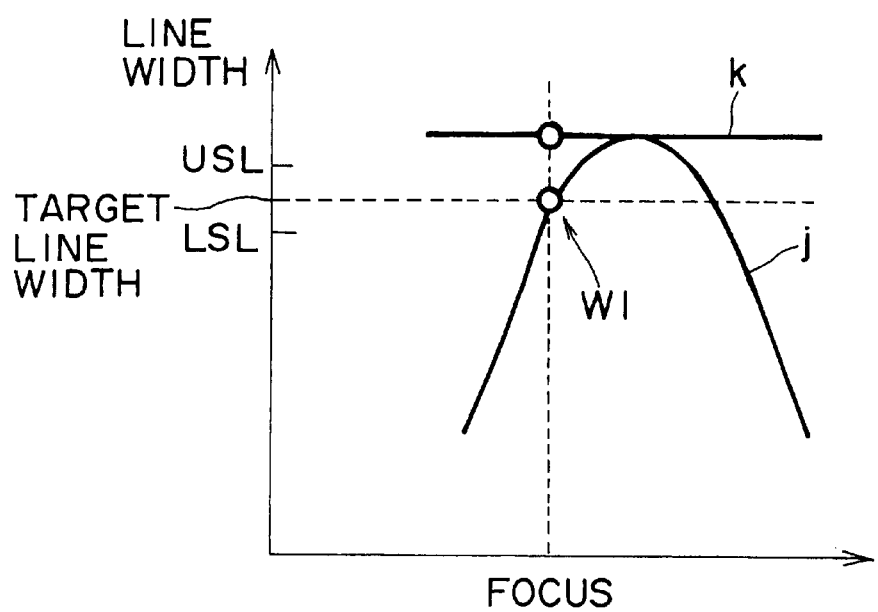
Figure 14:
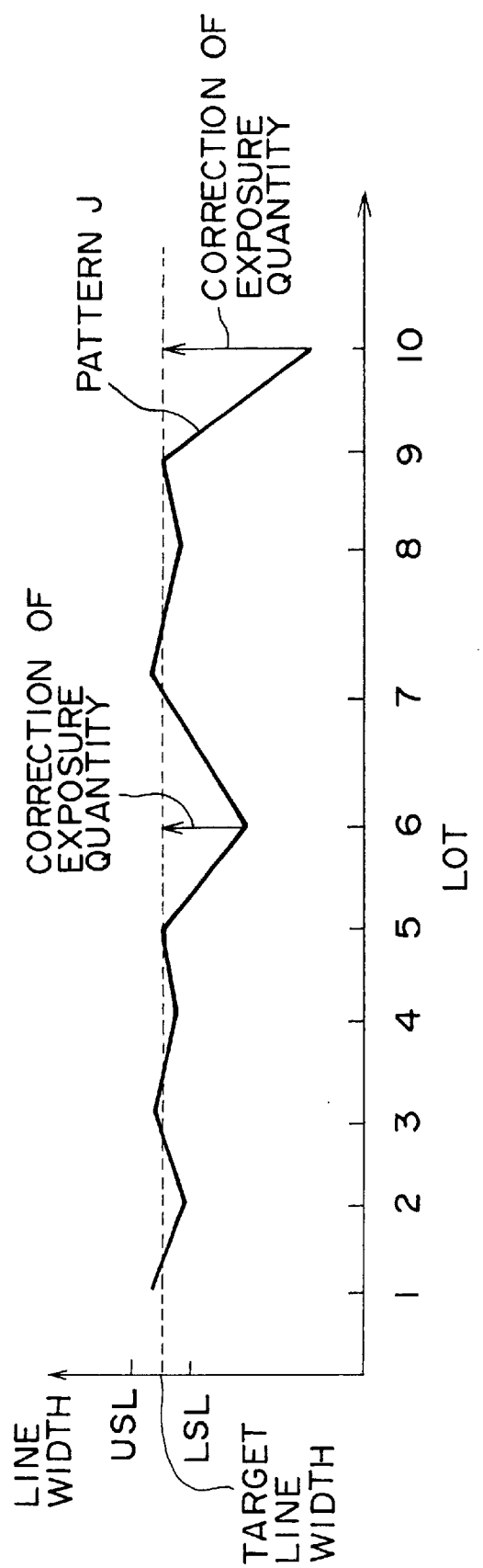
FIG. 14 is a characteristic graph for describing the relation between the focus and the interconnection width.

FIG. 11A shows the focus versus interconnection width characteristics for the case of occurrence of both sensitivity variation and focus variation as the result of exposure. FIG. 11B shows the focus versus interconnection width characteristics for the case of occurrence of both sensitivity variation and focus variation as the result of exposure after correction of the exposure condition.

FIG. 11A shows the focus versus interconnection width characteristics of the interconnection width characteristics of the interconnection pattern for the case of occurrence of both sensitivity variation and focus variation as the result of exposure. FIG. 11B shows the focus versus interconnection width characteristics for the case of occurrence of both sensitivity variation and focus variation as the result obtained after correction by focus correction magnitude ΔF and exposure quantity correction magnitude ΔE.

Because the focus correction magnitude ΔF and the exposure quantity correction magnitude ΔE as shown in FIG. 11A are detected separately and used for correction respectively, the interconnection width of both sparse exposure pattern and dense exposure pattern can be adjusted to the target line width. The focus variation of poor interconnection width characteristics of the interconnection pattern can be corrected by this method, and shifted to the stable area, thus the stability of the interconnection width of an exposed interconnection pattern is improved.

According to the embodiment of the present invention, when an exposure pattern is exposed on a wafer WH, focus variation and sensitivity variation are detected separately when the focus and the sensitivity vary without previous calculation of the optimal exposing correction magnitude for obtaining interconnection width of target size of interconnection pattern of IC's. The exposure condition is corrected separately based on the detected result.

The present invention is by no means limited to the above-mentioned embodiment.

Though two management patterns are used in the above-mentioned exposure method, three or more management patterns may be used. Though the exposure quantity is detected first when both focus variation and exposure quantity variation occur, the focus variation may be detected first and the same result is obtained.

The method for manufacturing semiconductor devices which is described with reference to the preferred embodiment of the present invention can be applied to the method other than that for manufacturing semiconductor devices in which a predetermined exposure pattern is transferred onto an object.

As described hereinbefore, according to the present invention, the focus position variation and sensitivity variation are detected separately to correct the exposure condition without previous calculation of the optimal correction magnitude for obtaining the interconnection width of target size of an interconnection pattern of a semiconductor device, the interconnection pattern of the target interconnection width is thereby exposed, the trend of the focus position and sensitivity is managed accurately, the interconnection pattern having different line density of the interconnection pattern is exposed accurately, and the production efficiency of semiconductor devices is improved.

What is claimed is:

1. A method for manufacturing semiconductor devices in which exposure is performed to form an interconnection pattern of the predetermined circuit on a semiconductor substrate with correction of the exposure condition comprising:

a first step for exposing on said semiconductor substrate the first exposure management pattern having interconnection patterns which are disposed with a certain interval and disposed so that the variation in the exposure quantity on said semiconductor substrate affects the interconnection width but the variation in focus position which occurs when said semiconductor substrate is exposed does not affect the interconnection width, and the second exposure management pattern having interconnection patterns which are disposed with a certain interval different from that of said first exposure management pattern and disposed so that both focus variation and exposure quantity variation affect the interconnection width;

a second step for measuring the interconnection width of the interconnection patterns of respective the first interconnection pattern and the second interconnection pattern exposed on said substrate by use of respective said first exposure management pattern and said second exposure management pattern, a third step for detecting the variation magnitude of the focus position based on the difference in interconnection width of the interconnection pattern between said first interconnection pattern and said second interconnection pattern; and a fourth step for detecting the variation magnitude of the exposure quantity based on the difference between the interconnection width of at least one interconnection pattern of said first interconnection pattern and said second interconnection pattern and the predetermined target interconnection width.

2. A method for manufacturing semiconductor devices as claimed in claim 1, wherein the second exposure management pattern is so sparse that at least one interconnection pattern is exposed, and the line density of said first management pattern is denser than that of said second management pattern.

3. A method for manufacturing semiconductor devices as claimed in claim 1, further comprising:

a fifth step for correcting the focus position based on the difference in interconnection width between said first interconnection pattern and said second interconnection pattern; and a sixth step for correcting the exposure quantity based on the difference between the interconnection width of at least one interconnection pattern of said first interconnection pattern and said second interconnection pattern and the predetermined target interconnection width.

4. A method for manufacturing semiconductor devices as claimed in claim 3, wherein in said fifth step the correction magnitude is determined with reference to a previously prepared table based on the variation magnitude of the focus position measured in the third step to correct the focus position.

5. A method for manufacturing semiconductor devices as claimed in claim 3, wherein in said sixth step the correction magnitude is determined with reference to a previously prepared table based on the variation magnitude of the exposure quantity measured in said fourth step to correct the exposure quantity.

6. A method for manufacturing semiconductor devices, comprising:

(i) presenting a substrate having a surface;

(ii) presenting an exposure pattern having at least a first management line pattern and a second management line pattern, wherein the first management line pattern defines a first management line density that is different from a second management line density of the second management line pattern, wherein the exposure pattern includes at least one shot pattern;

(iii) employing an exposure condition to transfer from the exposure pattern to the surface of the substrate at least (a) a first actual line pattern from the first management line pattern, wherein the first actual line pattern includes a plurality of first actual lines, each defining a first actual line width, and (b) a second actual line pattern from the second management line pattern, wherein the second actual line pattern includes a plurality of second actual lines, each defining a second actual line width, wherein the exposure condition includes a focus position F;

(iv) calculating a focus correction magnitude $\Delta F$ based on a difference between a first actual line width and a second actual line width;

(v) employing the focus correction magnitude $\Delta F$ to correct the focus position F; and (vi) returning to (iii).

7. The method of claim 6, prior to (iv) calculating a focus correction magnitude $\Delta F$, the method further comprising:

determining whether a focus deviation is detected based on a first actual line width and a second actual line width; and if a focus deviation is detected, continuing with (iv).

8. The method of claim 7, wherein the first management line pattern includes a plurality of first management lines, each defining a first management line width, wherein the exposure condition further includes an exposure quantity E and, prior to (vi) returning to (iii), the method further comprising:

calculating an exposure correction magnitude ΔE based on a difference between a first management line width and a first actual line width; and employing the exposure correction magnitude ΔE to correct the exposure quantity E.

9. The method of claim 8, prior to calculating an exposure correction magnitude ΔE, the method further comprising:

determining whether a sensitivity deviation is detected based on a first management line width and a first actual line width; and if a sensitivity deviation is detected and if a focus deviation is detected, continuing with (iv).

10. The method of claim 6, wherein the exposure pattern includes at least one shot pattern that defines a center and four corners and wherein one of the first management line pattern and the second management line pattern is disposed at the center and at each of the four corners of the at least one shot pattern.

11. The method of claim 6, wherein the first management line pattern is adapted to produce a first actual line pattern having a plurality of first actual lines, where each first actual line defines a width that is constant over variations in the focus position F.

12. The method of claim 11, wherein the second management line pattern is adapted to produce a second actual line pattern having a plurality of second actual lines, where each second actual line defines a width that varies over variations in the focus position F.

13. The method of claim 12, wherein the width of each second actual line varies in the shape of a parabola over variations in the focus position F.

14. The method of claim 13, wherein the shape of the parabola is a mountain-shaped parabola.

15. The method of claim 13, wherein the shape of the parabola is a valley-shaped parabola.

16. The method of claim 6, wherein the first management line density is less than the second management line density.

17. The method of claim 16, wherein the first management line pattern includes a plurality of first management lines defining widths, wherein the first management line density equals a width of a first management line.

18. The method of claim 6, wherein the first management line density is greater than the second management line density.

19. The method of claim 18, wherein the at least one shot pattern includes one actual circuit pattern and wherein the first management line pattern includes five lines.

* * * * *